US010269760B2

(12) United States Patent
Lin et al.

(10) Patent No.: US 10,269,760 B2
(45) Date of Patent: Apr. 23, 2019

(54) ADVANCED CHIP TO WAFER STACKING

(71) Applicant: International Business Machines Corporation, Armonk, NY (US)

(72) Inventors: Wei Lin, Albany, NY (US); Spyridon Skordas, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/815,769

(22) Filed: Nov. 17, 2017

(65) Prior Publication Data

US 2018/0068974 A1 Mar. 8, 2018

Related U.S. Application Data

(63) Continuation of application No. 15/041,060, filed on Feb. 11, 2016, now abandoned, which is a
(Continued)

(51) Int. Cl.
*H01L 23/00* (2006.01)
*H01L 25/00* (2006.01)
(Continued)

(52) U.S. Cl.
CPC ........ *H01L 24/83* (2013.01); *H01L 21/02057* (2013.01); *H01L 21/561* (2013.01); *H01L 21/67161* (2013.01); *H01L 21/67207* (2013.01); *H01L 21/67271* (2013.01); *H01L 21/67742* (2013.01); *H01L 21/6838* (2013.01); *H01L 21/78* (2013.01); *H01L 24/27* (2013.01);
(Continued)

(58) Field of Classification Search
CPC ......... B25B 11/00; B25B 11/02; H01L 24/93; H01L 21/78
See application file for complete search history.

(56) References Cited

U.S. PATENT DOCUMENTS 6,148,239 A 11/2000 Funk et al.
7,385,283 B2 6/2008 Wu et al.
(Continued)

FOREIGN PATENT DOCUMENTS

CN 101558483 A 10/2009
CN 102893387 A 1/2013

OTHER PUBLICATIONS

IBM, List of IBM Patents or Patent Applications Treated as Related, Appendix P, dated Dec. 20, 2017, 2 pages.
(Continued)

*Primary Examiner* — Lee D Wilson
(74) *Attorney, Agent, or Firm* — L. Jeffrey Kelly

(57) ABSTRACT

A method and structure for forming a 3D chip stack using a vacuum chuck. The method may include: forming a first bonding layer on a first wafer and first chips, where the first chips are on a first substrate; forming a second bonding layer on a second wafer and second chips, where the second chips are on a second substrate; separating the second chips from the second wafer, wherein a portion of the second bonding layer remains on the second chips; moving the separated second chips to a cleaning chamber using a vacuum chuck; cleaning the separated second chips in the cleaning chamber; and bonding the second bonding layer on the separated second chips to the first bonding layer on the first chips.

5 Claims, 13 Drawing Sheets

Related U.S. Application Data continuation of application No. 14/972,164, filed on Dec. 17, 2015, now Pat. No. 9,881,896.

(51) Int. Cl.

| | | |
|---|---|---|
| *H01L 21/683* | (2006.01) | |
| *H01L 21/02* | (2006.01) | |
| *H01L 21/56* | (2006.01) | |
| *H01L 25/065* | (2006.01) | |
| *H01L 21/677* | (2006.01) | |
| *H01L 21/67* | (2006.01) | |
| *H01L 21/78* | (2006.01) | |

(52) U.S. Cl.
CPC .............. *H01L 24/75* (2013.01); *H01L 24/94* (2013.01); *H01L 24/95* (2013.01); *H01L 25/0657* (2013.01); *H01L 25/50* (2013.01); *H01L 2224/27002* (2013.01); *H01L 2224/7501* (2013.01); *H01L 2224/7565* (2013.01); *H01L 2224/75981* (2013.01); *H01L 2224/83005* (2013.01); *H01L 2224/83193* (2013.01); *H01L 2224/83896* (2013.01); *H01L 2224/95001* (2013.01); *H01L 2224/951* (2013.01); *H01L 2225/06541* (2013.01)

(56) References Cited

U.S. PATENT DOCUMENTS

| | | | |
|---|---|---|---|
| 8,319,329 B2 | 11/2012 | Kang et al. | |
| 8,426,256 B2 | 4/2013 | Hsiao et al. | |
| 8,697,542 B2 | 4/2014 | Pascual et al. | |
| 8,754,507 B2 | 6/2014 | Xie et al. | |
| 9,799,507 B2 * | 10/2017 | Canale .............. | H01L 21/02076 |
| 2006/0264004 A1 | 11/2006 | Tong et al. | |
| 2008/0090505 A1 * | 4/2008 | Yoshida .................... | B24B 1/00 |
| | | | 451/413 |
| 2008/0268752 A1 * | 10/2008 | Nemoto .................. | B24B 7/228 |
| | | | 451/8 |
| 2009/0042488 A1 * | 2/2009 | Sekiya .................... | B24B 7/228 |
| | | | 451/41 |
| 2010/0264551 A1 | 10/2010 | Farooq et al. | |
| 2010/0326702 A1 | 12/2010 | Dang et al. | |
| 2011/0215465 A1 | 9/2011 | Rahman et al. | |
| 2013/0011968 A1 | 1/2013 | Bartley et al. | |
| 2014/0232013 A1 | 8/2014 | Wu et al. | |
| 2015/0037914 A1 | 2/2015 | Takahashi et al. | |
| 2015/0038062 A1 * | 2/2015 | Umeda ............. | H01L 21/67219 |
| | | | 451/70 |
| 2015/0129999 A1 | 5/2015 | Cassidy et al. | |
| 2015/0228535 A1 | 5/2015 | Cassidy et al. | |
| 2015/0155263 A1 | 6/2015 | Farooq et al. | |
| 2015/0214082 A1 | 7/2015 | Huang et al. | |
| 2015/0235949 A1 | 8/2015 | Yu et al. | |
| 2015/0382520 A1 | 12/2015 | Takamiya et al. | |
| 2017/0179077 A1 | 6/2017 | Lin et al. | |

OTHER PUBLICATIONS

Pending U.S. Appl. No. 15/815,777, filed Nov. 17, 2017, entitled: "Advanced Chip to Wafer Stacking ", 27 pages.

Di Cioccio et al., "An Innovative Die to Wafer 3D Integration Scheme: Die to wafer oxide or copper direct bonding with planarised oxide inter-die filling", 2009 IEEE, 4 pages.

Fukushima et al., "Surface Tension-Driven Chip Self-Assembly with Load-free Hydrogen Fluoride-assisted Direct Bonding at Room Temperature for Three-Dimensional Integrated Circuits", Applied Physics Letters, vol. 96, 154105 (2010), pp. 154105-1-154105-3.

Kuhne et al., "Wafer-level packaging and direct interconnection technology based on hybrid bonding and through silicon vias", IOP Publishing, Journal of Micromechanics and Microengineering, vol. 21, 2011, No. 085032, pp. 1-7.

Sillon et al., "Enabling technologies for 3D intergration: From packaging miniaturization to advanced stacked ICs", Published in Electron Devices Meeting, 2008, IEDM, pp. 1-4.

* cited by examiner

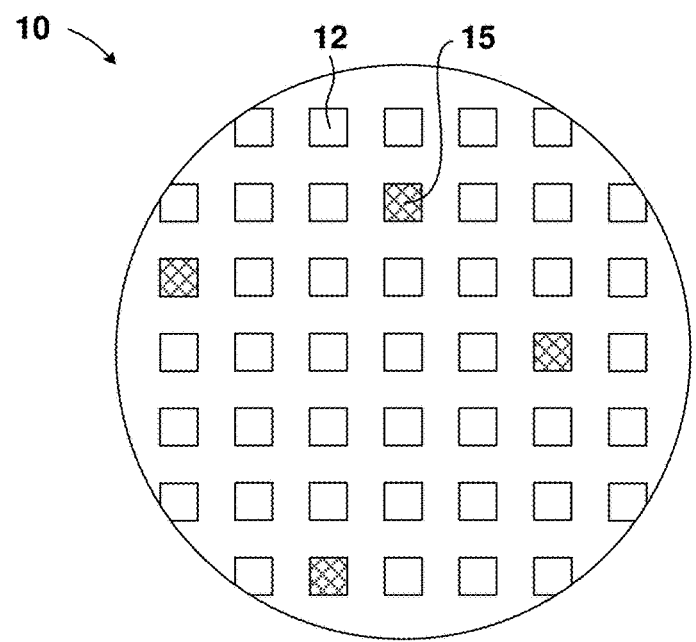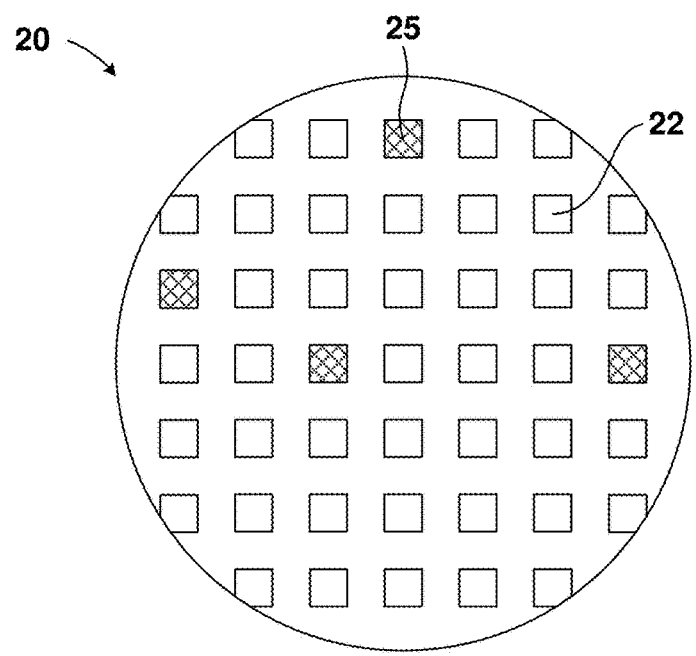
Fig. 1

ADVANCED CHIP TO WAFER STACKING

BACKGROUND

The present invention generally relates to semiconductor device manufacturing, and more particularly to fabricating a chip stack using chip-to-wafer bonding.

Assemblies of vertically stacked semiconductor chips having direct vertical electrical interconnections using through silicon vias (TSV) offer improvements in integration density and speed of information access. Wafer-to-wafer bonding techniques can be used to join wafers together in vertically stacked wafer assemblies, which can then be diced into individual stacked semiconductor chip assemblies containing stacks of two or more semiconductor chips each. Chip-to-chip bonding techniques can also be used to join vertically stacked chip assemblies. Chip-to-chip bonding involves separating the semiconductor chips from their respective wafers prior to bonding the chips together in a stack. Chip-to-chip bonding has the benefit that the chips are not constrained by size or aspect ratio, so practically any combination of chips, within reasonable limits, can be bonded together. Chip-to-chip bonding also can be used to bond practically any number of chips together in a stack. Furthermore, chips can be tested prior to bonding, thus enabling defective chips to be sorted out and discarded, thereby providing a higher yield for the overall stack arrangements. Each individual stacked semiconductor chip assembly may have through silicon vias extending in a vertical direction of the assembly for electrically connecting the chips therein.

SUMMARY

According to one embodiment of the present invention, a method is provided. The method may include: forming a first bonding layer on a first wafer and first chips, wherein the first chips are on a first substrate; forming a second bonding layer on a second wafer and second chips, wherein the second chips are on a second substrate; separating the second chips from the second wafer, wherein a portion of the second bonding layer remains on the second chips; moving the separated second chips to a cleaning chamber using a vacuum chuck; cleaning the separated second chips in the cleaning chamber; and bonding the second bonding layer on the separated second chips to the first bonding layer on the first chips.

According to another embodiment of the present invention, a method is provided. The method may include: providing a first wafer having first chips on a first substrate, the first chips include a first conductive connector, and the first chips have a coplanar top surface with a top surface of the first substrate; providing a second wafer having second chips on a second substrate, the second chips include a second conductive connector, and the second chips have a coplanar top surface with a top surface of the second substrate; forming a first bonding layer on the coplanar top surface of the first chips and the first substrate; forming a second bonding layer on the coplanar top surface of the second chips and the second substrate; separating the second chips from the second wafer; placing the separated second chips in loading bays of a vacuum chuck, wherein a location of each of the loading bays is in a corresponding position to each of the first chips on the first wafer, the separated second chips are held in the loading bays using vacuum suction to a surface of the separated second chips opposite the second bonding layer; bonding the second chips to the first chips by contacting the second bonding layer to the first bonding layer and using a bonding process creating a third bonding layer, wherein the third bonding layer includes the first bonding layer and the second bonding layer; and depositing a dielectric over the bonded first chips and second chips.

According to another embodiment of the present invention, a structure is provided. The structure may include: a vacuum chuck having loading bays including a curved surface for receiving a plurality of separated second chips, wherein a location of each loading bay corresponds with a location of each of a plurality of first chips mounted on a first substrate; and a movable arm attached to the vacuum chuck, wherein the movable arm is capable of moving the vacuum chuck.

BRIEF DESCRIPTION OF THE DRAWINGS

The following detailed description, given by way of example and not intended to limit the invention solely thereto, will best be appreciated in conjunction with the accompanying drawings, in which:

FIG. 1 is a top view of a first and second wafer having a plurality of first and second chips, respectively, according to an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 2:
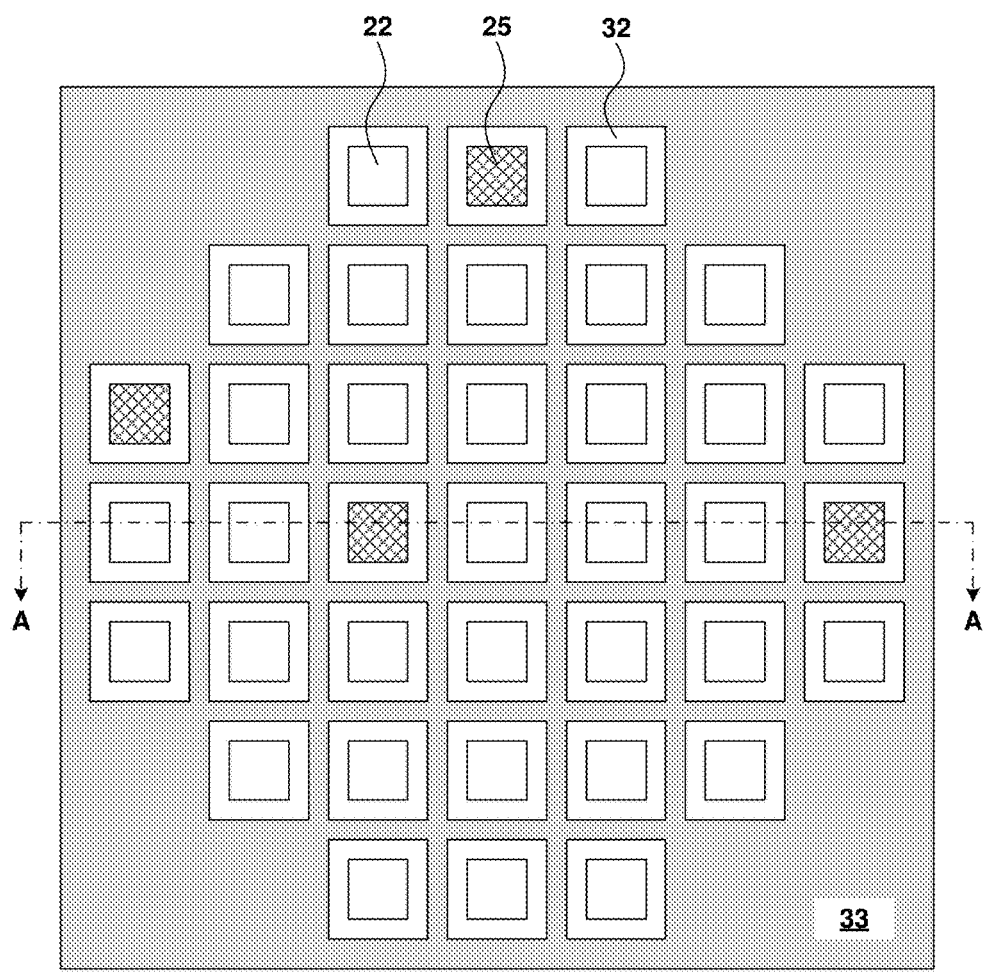
FIG. 2 is a top view of loading bays of a vacuum chuck, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to fabricating a chip stack using chip-to-wafer bonding. Ideally, it is good to use Known Good Dice (KGD) when using chip-to-chip bonding to increase throughput. It is also good to use wafer scale bonding to allow for better chip alignment. One way to fabricate a chip stack using KGD and employing wafer scale bonding is to place KGD from a diced wafer on a movable chuck and using oxide bonding to bond the KGD to an intact wafer. One embodiment by which to form a chip stack using chip-to-wafer bonding is described below referring to the accompanying drawings FIG. 1-20.

With reference to FIGS. 1-4, a demonstrative illustration of the present invention is provided, according to an embodiment. More specifically, KGD from a diced wafer are bonded on chips of an intact wafer. In the present embodiment, a first wafer 10 will remain intact and a second wafer 20 will be diced to separate a plurality of chips. The diced chips from the second wafer 20 may be aligned to the chips of the first wafer 10 and bonded using oxide bonding. It should be noted, a high level description of an embodiment is presented in FIGS. 1-4, while a detailed description of the chips, bonding techniques, and tools are further described in reference to FIGS. 5-20.

Now referring to FIG. 1, a demonstrative illustration of the first wafer 10 and the second wafer 20 each having a plurality of chips is provided, according to an embodiment. More specifically, both the he first wafer 10 and the second wafer 20 may include some defective chips 15, 25 and some KGD 12, 22, where the KGD 12, 22 are ideal for fabrication of 3D chip stacks.

The first wafer 10 may remain intact and be a bottom level of 3D chip stacks to be fabricated within a stacking area. The defective chips 15 and the KGD 12 within the stacking area may be located using any known quality detection technique known in the art. In an embodiment, the first wafer 10 includes four defective chips 15 within the stacking area. The stacking area is the entire wafer in an exemplary embodiment; however, any shape covering any area may be used. In an alternative embodiment (not illustrated), a stacking area may include all full and functioning chips on the first wafer 10.

The chips on the second wafer 20 may be prepared for 3D chips stacking by separating each chip from the second wafer 20 using any die separation technique known in the art, such as, for example, a back-grind and dicing saw process. The defective chips 25 may be discarded or used in a subsequent stacking process. In the exemplary embodiment, four of the defective chips 25 may be used to stack on the four defective chips 15 within the stacking area.

Now referring to FIG. 2, a demonstrative illustration of a die handler 33 is provided, according to an embodiment. More specifically, the chips from the second wafer 20 are diced and placed into loading bays 32 on the die handler 33. The chips may be arranged such that the KGD 22 may be placed in loading bay positions that correspond to KGD 12 within the stacking area of the first wafer 10 and, optionally, defective chips 25 may be placed in loading bay positions that correspond to defective chips 15.

Figure 3:
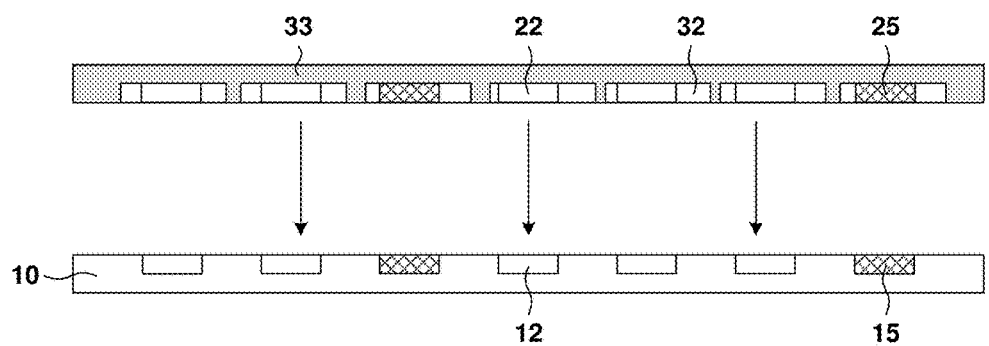
FIG. 3 is a cross sectional view of the vacuum chuck and a first wafer, according to an exemplary embodiment.
Figure 4:
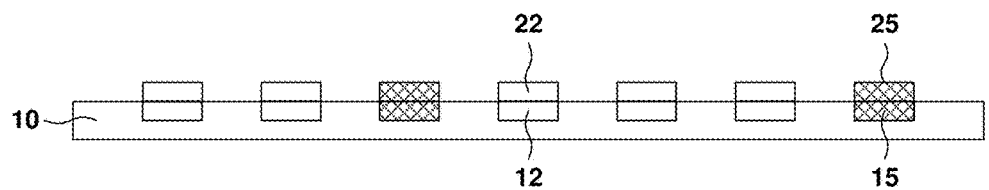
FIG. 4 is a cross sectional view of the second chips bonded to first chips on the first wafer, according to an exemplary embodiment.

Now referring to FIGS. 3 and 4, a demonstrative illustration of the bonding of the chips on the die handler 33 to the chips of the first wafer 10 is provided, according to an embodiment. FIGS. 3 and 4 are cross sectional front views of the die handler 33 and the first wafer 10 taken along cross sectional line A-A of FIG. 2.

The location of the chips within each loading bay 32 and the chips on the second wafer 20 may be measured and mapped using any tool known in the art, such as, for example, a microscope. The chips within the loading bays 32 may be moved to match the location of corresponding chips on the first wafer 10. In an embodiment, the loading bays 32 may be movable to line up the corresponding chips, while an alternative embodiment may include moving the chips within the loading bays 32 using micro-motion controllers.

The KGD 22 taken from the second wafer 20 may be stacked on KGD 12 of the first wafer 10, while defective chips 25 from the second wafer 20 may be stacked on defective chips 15 of the first wafer 10 in order to preserve the integrity of the wafer for downstream processing by using defective chips on top of know defective chips or chip stacks. The chips may be bonded using oxide bonding which will be described in further detail with reference to FIG. 14.

Figure 5:
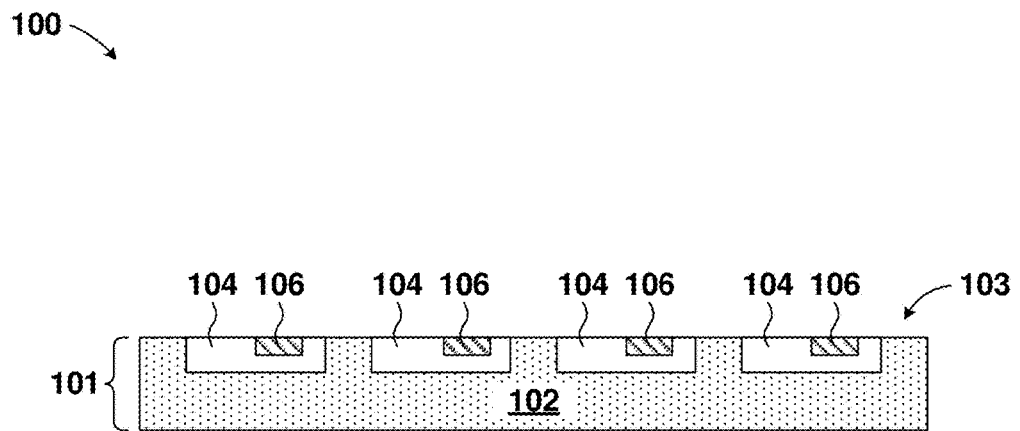
FIG. 5 is a cross sectional view of a first wafer, according to an exemplary embodiment.
Figure 6:
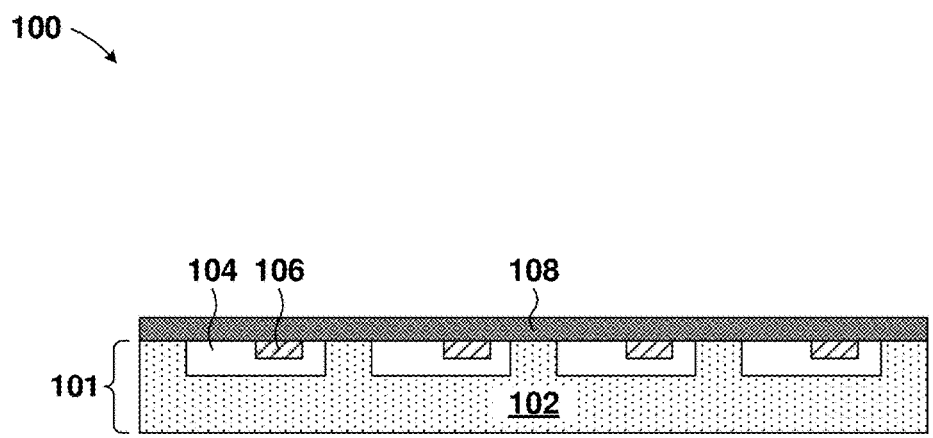
FIG. 6 is a cross sectional view of a first bonding layer on the first wafer, according to an exemplary embodiment.

With reference to FIGS. 5 and 6, a demonstrative illustration of the formation of a first wafer 101 is provided, according to an embodiment. The first wafer 101 may be similar to the first wafer 10 described in reference to FIG. 1.

Now referring to FIG. 5, a demonstrative illustration of a structure 100 is provided during an intermediate step of a method of bonding chips in a 3D chip stack using a chip-to-wafer process, according to an embodiment. More specifically, the structure 100 includes the first wafer 101 having a first plurality of chips 104 on a first substrate 102. The top side of the first wafer 101 may be referred to as the face 103 of the first wafer 101.

The first substrate 102 may include; a bulk semiconductor substrate, a layered semiconductor substrate (e.g., Si/SiGe), a silicon-on-insulator substrate (SOI), or a SiGe-on-insulator substrate (SGOI). The first substrate 102 may include any semiconductor material known in the art, such as, for example; Si, Ge, SiGe, SiC, SiGeC, Ga, GaAs, InAs, InP, or other elemental or compound semiconductors. The first substrate 102 may include, for example; an n-type, p-type, or undoped semiconductor material and may have a monocrystalline, polycrystalline, or amorphous structure.

The first chips 104 may be any chips known in the art, such as, for example, field-programmable gate arrays (FPGAs), processors, application-specific ICs (ASICs), or memory chips (e.g., RAM). The first chips 104 may be of the same type (e.g., all FPGA chips), or different types (e.g., some FPGAs and some RAM chips). In some embodiments, the first chips 104 may be homogeneous integrations, but it may also be cost-effective to use heterogeneous integrations. The first chips 104 may be formed in the first substrate 102 using any chip formation process known in the art. The first chips 104 and first substrate 102 may be planarized using any polishing or grinding technique known in the art, such as, for example, chemical-mechanical polishing (CMP) resulting in a coplanar top surface between the first chips 104 and the first substrate 102.

The first chips 104 may include first conductive connectors 106. The first conductive connectors 106 may be connectors designed to electrically connect one of the first chips 104 to another first chip 104 or to chips on a different level of a chip stack. The first conductive connectors 106 may be any conductive material known in the art, such as, for example, copper.

Now referring to FIG. 6, a demonstrative illustration of the structure 100 is provided, according to an embodiment. More specifically, a first bonding layer 108 be formed on the face 103 of the first wafer 101.

The first bonding layer 108 may be deposited on the face of the first wafer 101 using any deposition technique known in the art, such as, for example, chemical vapor deposition (CVD), plasma enhanced chemical vapor deposition (PECVD), atomic layer deposition (ALD), or physical vapor deposition (PVD). The first bonding layer 108 may be any dielectric and/or bonding material known in the art, such as, for example, silicon dioxide, silicon nitride, a multilayer combination, or any other bonding material known in the art.

The first bonding layer 108 may have a thickness ranging from about 10 nm to about 10 microns.

With reference to FIGS. 7-12, a demonstrative illustration of the separation of second chips 204 from a second wafer 201 is provided, according to an embodiment. The second wafer 201 may be similar to the second wafer 20 described in reference to FIG. 1.

Figure 7:
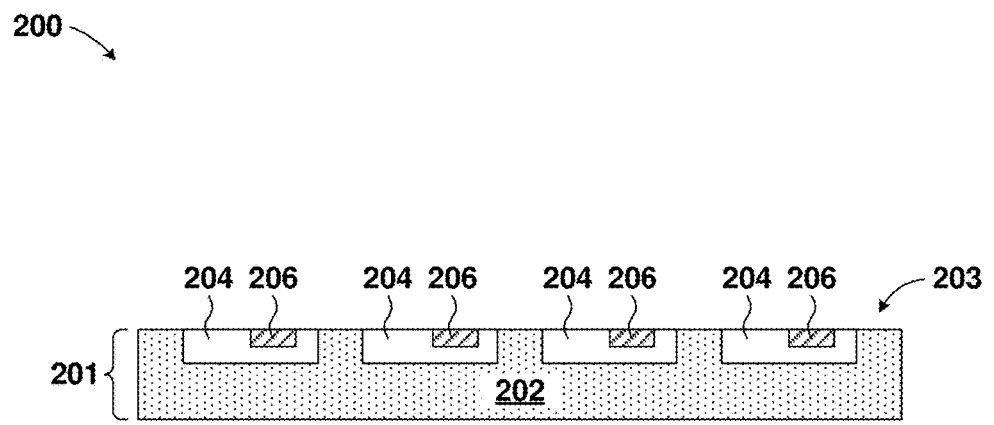
FIG. 7 is a cross sectional view of a second wafer, according to an exemplary embodiment.

Now referring to FIG. 7, a demonstrative illustration of a structure 200 is provided, according to an embodiment. More specifically, the structure 200 may include the second wafer 201 having the second chips 204 on a second substrate 202. The second chips 204 may include second conductive connectors 206 similar to the first conductive connectors 106 described in reference to FIG. 5. The top side of the second wafer 201 may be referred to as the face 203 of the second wafer 201.

Figure 8:
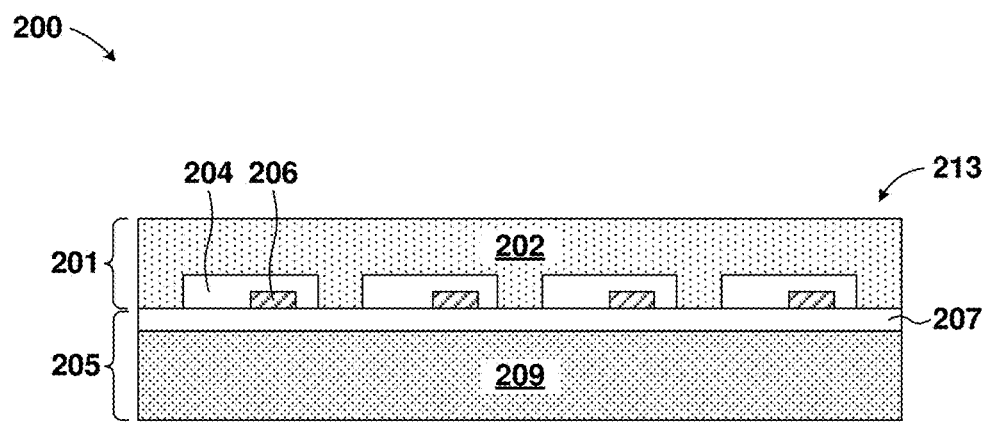
FIG. 8 is a cross sectional view of a handling substrate bonded to the second wafer, according to an exemplary embodiment.

With reference to FIG. 8, a demonstrative illustration of the structure 200 is provided, according to an embodiment. More specifically, a carrier 205 may be bonded to the face 203 of the second wafer 201 and flipped for a subsequent thinning step, described further with reference to FIG. 9.

The carrier 205 may include an adhesive layer 207 and a handler substrate 209. The adhesive layer 207 may be any adhesive material known in the art and may be the bonding agent that holds the second wafer 201 to the handler substrate 209. The handler substrate 209 may be any handling material known in the art, for example, glass.

Figure 9:
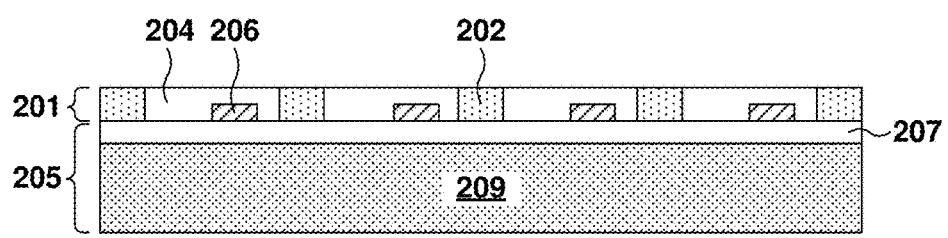
FIG. 9 is a cross sectional view of a thinned second wafer, according to an exemplary embodiment.

Now referring to FIG. 9, a demonstrative illustration of the structure 200 is provided, according to an embodiment. More specifically, the bottom surface 213 of the second wafer 201 may be thinned exposing a surface of the second chips 204.

The bottom surface 213 of the second wafer 201 may be polished (i.e., thinned) using any technique known in the art, such as, for example, a grinding and polishing process. This process may be performed using conventional grinding, polishing and/or chemical etching means. For instance, a backside grind and polish can be performed on the bottom surface 213 of the second wafer 201 to remove the second substrate 202 within 10-20 microns of the second chips 204. A wet etch can then be performed to expose the second chips 204.

Figure 10:
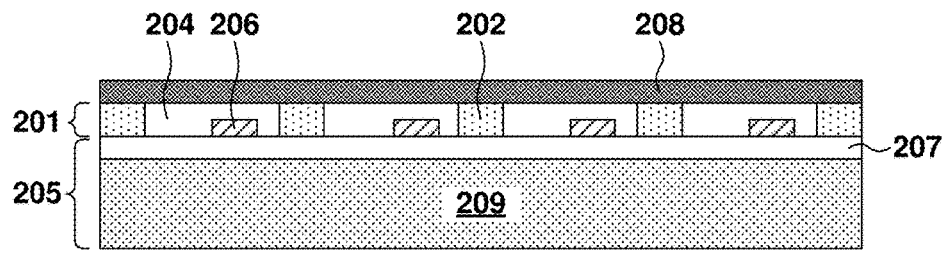
FIG. 10 is a cross sectional view of a second bonding layer on the second wafer, according to an exemplary embodiment.

Now referring to FIG. 10, a demonstrative illustration of the structure 200 is provided, according to an embodiment. More specifically, a second bonding layer 208 may be formed on the exposed surface of the second chips 204 and the second substrate 202.

The second bonding layer 208 may be deposited using any deposition technique known in the art, such as, for example, chemical vapor deposition (CVD), plasma enhanced chemical vapor deposition (PECVD), atomic layer deposition (ALD), or physical vapor deposition (PVD). The second bonding layer 208 may be any dielectric and/or bonding material known in the art, such as, for example, silicon dioxide, silicon nitride, a multilayer combination, or any other bonding material known in the art. The first bonding layer 208 may have a thickness ranging from about 10 nm to about 10 microns.

Figure 11:
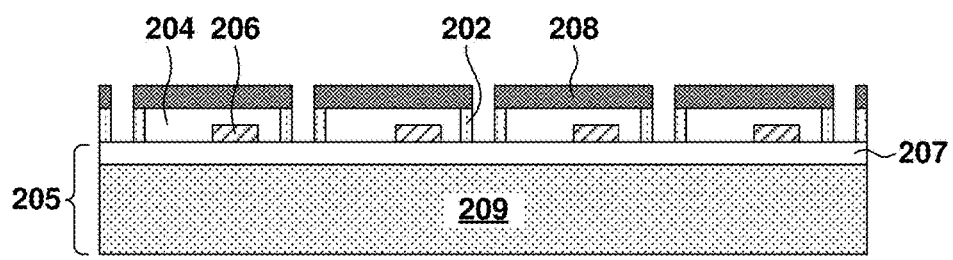
FIG. 11 is a cross sectional view of diced chips on the second wafer, according to an embodiment.
Figure 12:
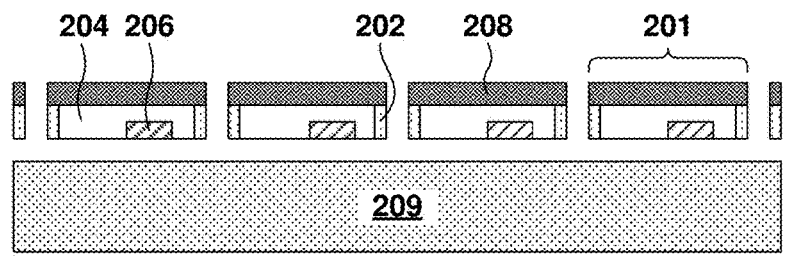
FIG. 12 is a cross sectional view of the separation of the diced chips from the second wafer, according to an embodiment.

Now referring to FIGS. 11 and 12, a demonstrative illustration of the structure 200 is provided, according to an embodiment. More specifically, the second chips 204 may be diced and debonded from the second wafer 201.

The second chips 204 may be diced and debonded from the second wafer 201 using any dicing and debonding techniques know in the art. Each of the second chips 204 may be tested and separated to remove faulty chips and to keep Known Good Dice (KGD). A tool may be used to move the KGD in alignment with the first chips 104 in the first wafer 101. The tool used is described further in reference to FIGS. 18-20.

Figure 13:
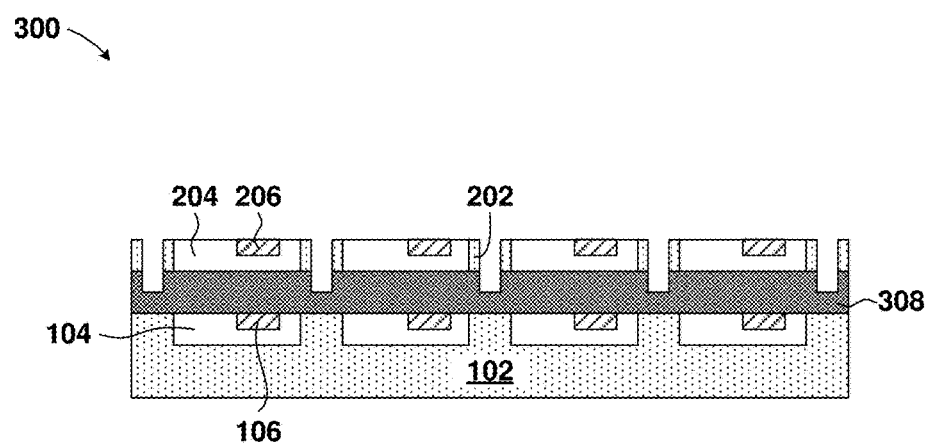
FIG. 13 is a cross sectional view of the second chips bonded to the first chips, according to an embodiment.

Now referring to FIG. 13, a demonstrative illustration of a bonded structure 300 is provided, according to an embodiment. More specifically, the bonded structure 300 includes the second chips 204 bonded to the first chips 104.

The first and second chips 104, 204 may be bonded in a 3D chip stack arrangement by bonding the first bonding layer 108 to the second bonding layer 208 creating a bonded layer 308. The bonded layer 308 may be optionally activated using an ammonium-based solution or other suitable technique to facilitate low-temperature oxide-to-oxide bonding, such as plasma activation or a micro-scrubbing technique.

Figure 14:
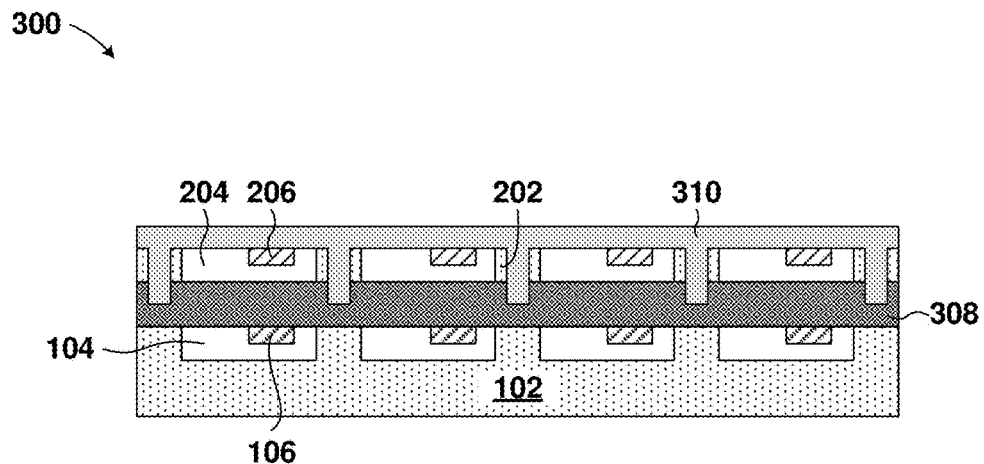
FIG. 14 is a cross sectional view of a dielectric layer deposited on the bonded first and second chips.
Figure 15:
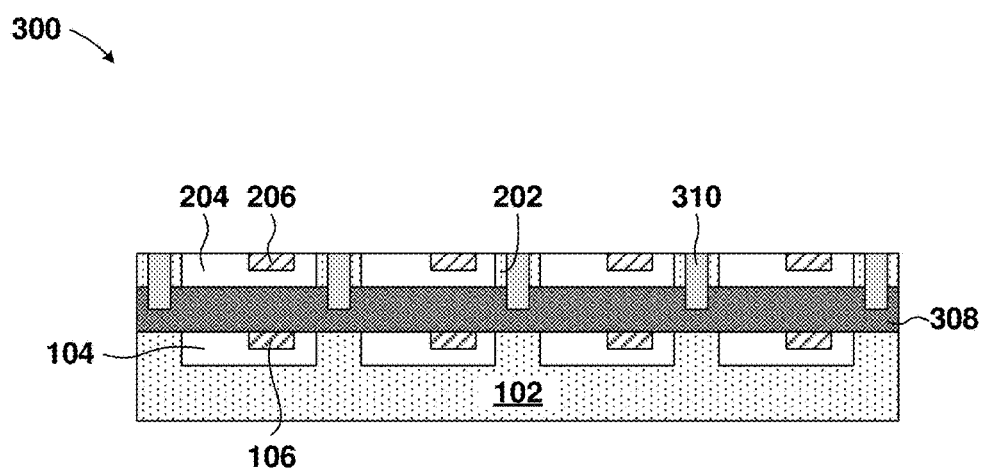
FIG. 15 is a cross sectional view of the bonded structure illustrating the removal of a portion of the dielectric layer, according to an embodiment.

Now referring to FIGS. 14 and 15, a demonstrative illustration of a bonded structure 300 is provided, according to an embodiment. More specifically, a dielectric 310 may be formed on the bonded KGD using any deposition technique known in the art, such as, for example, spin-on deposition, chemical vapor deposition, plasma-enhanced chemical vapor deposition, or any other known deposition technique used in the art; followed by an optional planarization process. The dielectric 310 may provide insulation between each of the second chips 204.

Figure 16:
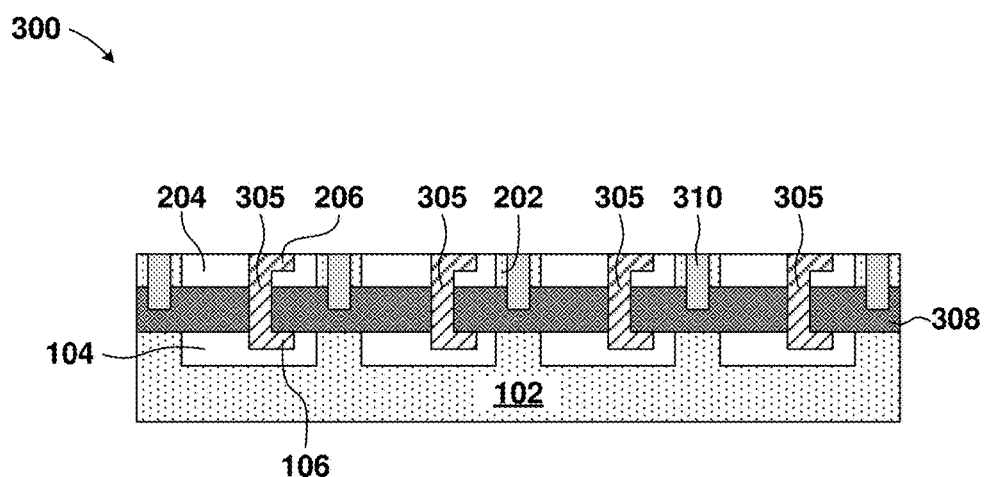
FIG. 16 is a cross sectional view of the bonded structure illustrating the formation of connecting lines between the first and second chips, according to an embodiment.
Figure 17:
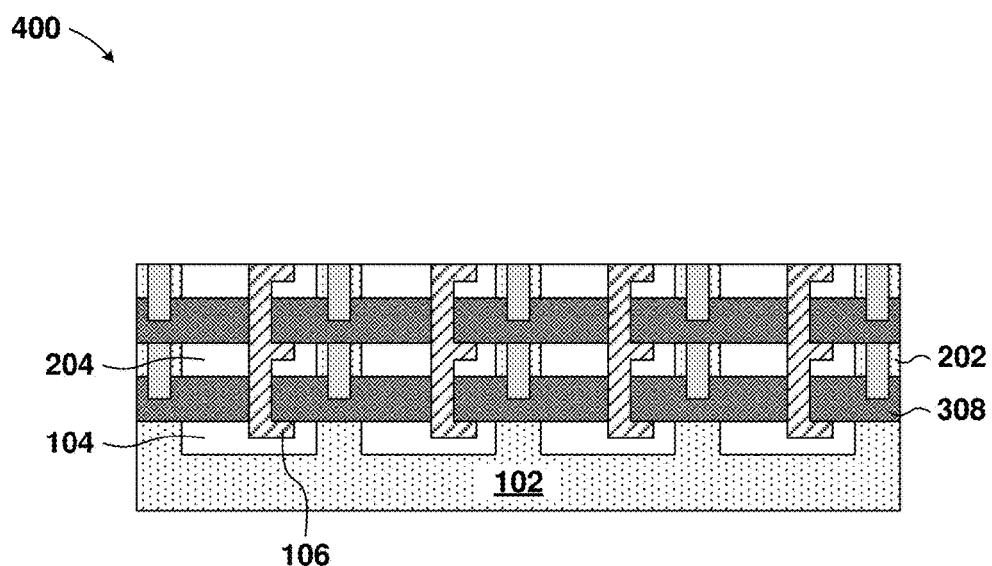
FIG. 17 is a cross sectional view of a multilayer chip stack, according to an embodiment.

Now referring to FIGS. 16 and 17, a demonstrative illustration of the bonded structure 300 is provided, according to an embodiment. More specifically, through silicon vias 305 (TSV's) may be formed vertically connecting the first chips 104 to the second chips 204. The TSV's may be formed using known TSV formation techniques, such as, for example an etch and fill process. The process described with reference to FIGS. 7-16 may be repeated for additional layers in a multi-stack chip set 400 as illustrated in FIG. 17. As part of this process of TSV formation, additional insulator layers may need to be deposited and additional metal layers may be needed to connect the formed TSVs to other metal interconnects on each chip.

Figure 18:
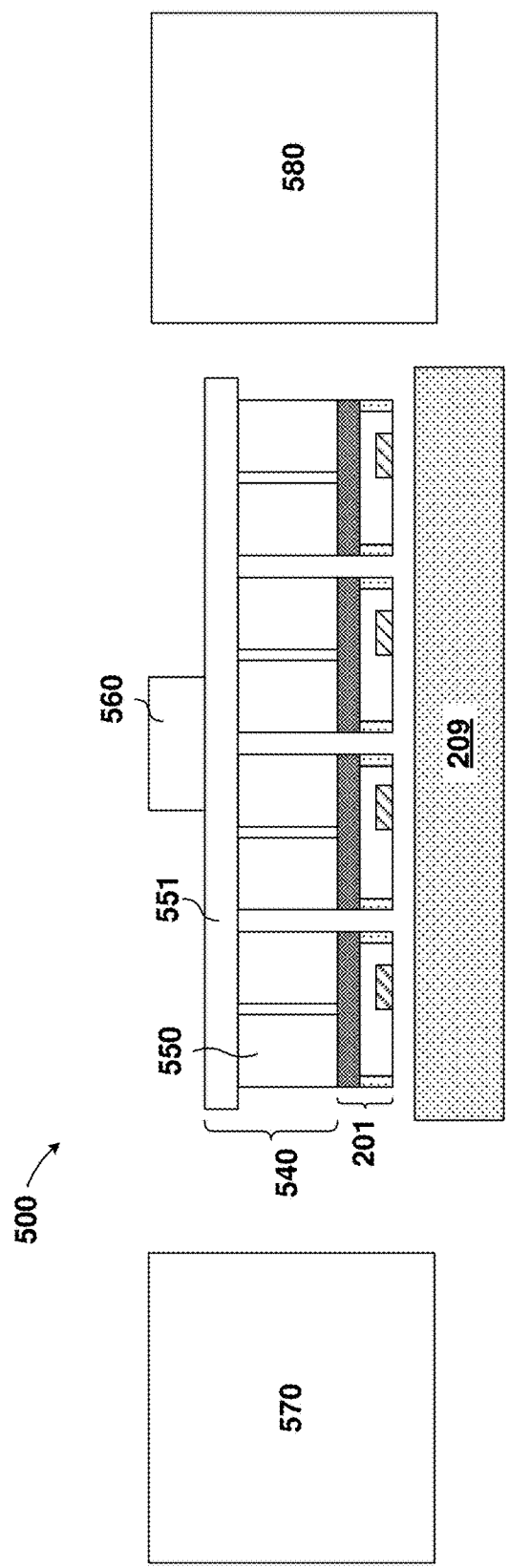
FIG. 18 is a cross sectional view of a vacuum chuck, according to an embodiment.
Figure 19:
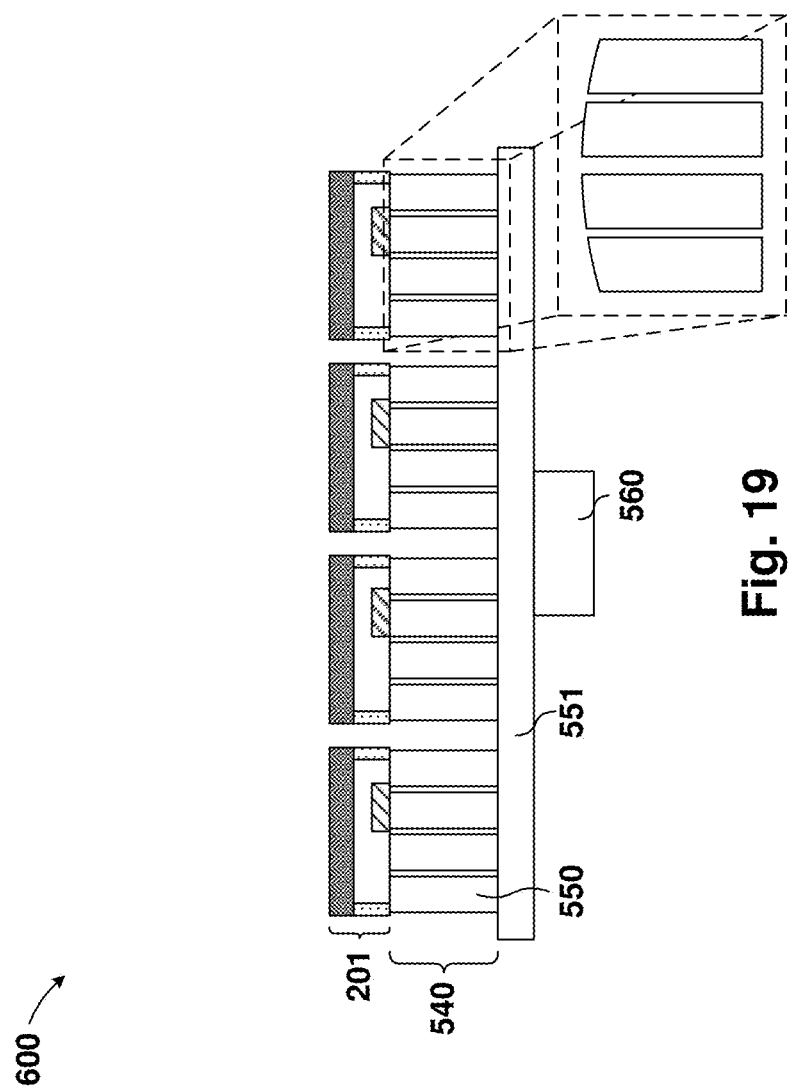
FIG. 19 is another cross sectional view of the vacuum chuck illustrating a curved surface of the vacuum chuck, according to an embodiment.
Figure 20:
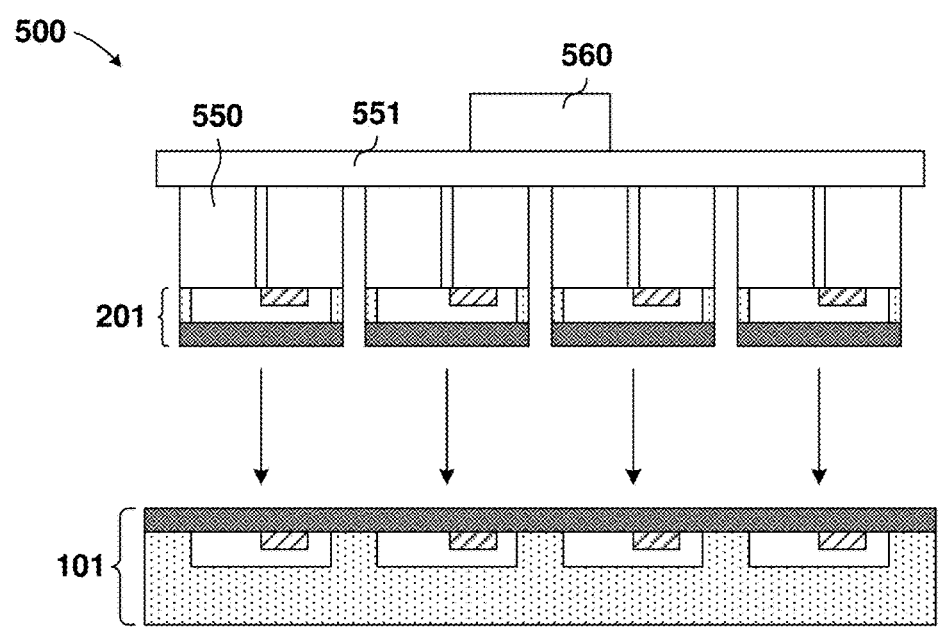
FIG. 20 is a cross sectional view of the vacuum chuck illustrating the alignment of the first and second chips, according to an embodiment.

With reference to FIGS. 18-20, a demonstrative illustration of a tool used to move, clean, and bond the second chips 204 to the first chips 104 is provided, according to an embodiment.

Now referring to FIG. 18, a demonstrative illustration of a structure 500 is provided, according to an embodiment. The structure 500 includes a vacuum chuck 540 with moveable columns 550 connect to a chuck handler 551.

The vacuum chuck 540 may be used to remove faulty chips and/or for alignment of the second chips 204 to the first chips 104. The vacuum chuck 540 may include loading bays similar to the loading bays 32 illustrated in FIG. 2. The vacuum chuck 540 can use vacuum suction to hold the second chips 204.

In an embodiment, the vacuum chuck 540 includes a movable arm 560 capable of moving the vacuum chuck and positioning/aligning the second chips 204 to the first chips 104.

In an embodiment, the movable arm 560 is used to move the vacuum chuck 540 and the second chips 204 into a cleaning chamber 570 for oxide layer cleaning on a receiving assembly (i.e., SC1/SC2). In the cleaning chamber, the second chips are cleaned while positioned in the loading bays of the vacuum chuck.

Additionally, the movable arm 560 is used to move the vacuum chuck 540 and second chips 204 in a plasma chamber 580 for surface activation (e.g., N2 plasma). Specifically, the second bonding layer 208 (FIGS. 10-13) on the separated second chips 204 is activated while the second chips 204 are positioned in the loading bays of the vacuum chuck.

Now referring to FIG. 19, a demonstrative illustration of an alternative structure 600 is provided, according to an embodiment. More specifically, the alternative structure 600 may include a plurality of moveable columns 550 (four illustrated) having a curved contact surface (exaggerated for illustrative purposes) to hold the second chips 204 and provided a better surface for oxide bonding. The curvature of these structures needs to be such that the height difference between the center and edges of the bow formed is in a range of about 1 mm to about 5 mm preferably, but other ranges may be used.

Now referring to FIG. 20, a demonstrative illustration of the structure 500 is provided, according to an embodiment. The second chips 204 may be aligned to the first chips 104 on the first wafer 101 in preparation for oxide-to-oxide bonding. After the second chips 204 are bonded to the first chips 104, the resulting structure may be similar to the bonded structure 300 described in reference to FIG. 13.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure for forming a 3D chip stack comprising:
    a vacuum chuck having loading bays including a curved top surface for receiving a plurality of separated second chips, wherein a location of each loading bay corresponds with a location of each of a plurality of first chips mounted on a first substrate; and
    a movable arm directly attached to the vacuum chuck, wherein the movable arm is capable of moving the vacuum chuck.

2. The structure of claim 1, further comprising:
    a cleaning chamber, wherein the cleaning chamber is capable of cleaning the separated second chips placed in the loading bays of the vacuum chuck.

3. The structure of claim 1, further comprising:
    an activation chamber, wherein the activation chamber is capable of activating a second bonding layer on the separated second chips placed in the loading bays of the vacuum chuck.

4. The structure of claim 1, wherein the movable arm is capable of moving the vacuum chuck into a cleaning chamber and an activation chamber.

5. The structure of claim 1, wherein the movable arm is capable of aligning the separated second chips in each loading bay with the first chips on the first substrate.

* * * * *